(12) United States Patent
Voo (10) Patent No.: US 7,683,702 B1
(45) Date of Patent: Mar. 23, 2010

(54) PROFILE CIRCUIT CONTROL FUNCTION

(75) Inventor: Thart Fah Voo, Singapore (SG)

(73) Assignee: Marvell International Ltd., Hamilton (BM)

( * ) Notice: Subject to any disclaimer, the term of this patent is extended or adjusted under 35 U.S.C. 154(b) by 109 days.

(21) Appl. No.: 11/821,912

(22) Filed: Jun. 26, 2007

(51) Int. Cl.
    *G05F 1/10* (2006.01)
(52) U.S. Cl. .................. 327/541; 327/378; 327/513
(58) Field of Classification Search .......... 327/378, 327/513, 541
    See application file for complete search history.

(56) References Cited

U.S. PATENT DOCUMENTS

| | | | | |
|---|---|---|---|---|
| 3,705,316 A | * | 12/1972 | Burrous et al. | 327/513 |
| 5,231,315 A | * | 7/1993 | Thelen, Jr. | 327/103 |
| 6,087,820 A | * | 7/2000 | Houghton et al. | 323/315 |
| 6,297,685 B1 | * | 10/2001 | Ewen et al. | 327/513 |
| 6,426,671 B1 | * | 7/2002 | Kono | 327/541 |
| 6,686,792 B2 | | 2/2004 | Nakamiya et al. | |
| 6,744,649 B1 | * | 6/2004 | Yang et al. | 363/98 |
| 7,064,602 B2 | * | 6/2006 | Nguyen | 327/541 |
| 7,208,931 B2 | * | 4/2007 | Aota | 323/315 |
| 7,215,145 B2 | * | 5/2007 | Kamijo | 326/82 |
| 2001/0033195 A1 | * | 10/2001 | Kanda et al. | 327/541 |
| 2002/0024380 A1 | * | 2/2002 | Kono | 327/541 |

OTHER PUBLICATIONS

Savant et al; "Electronic Design: Circuits and Systems"; Second Edition; Aug. 1990; 8 pages.

* cited by examiner

*Primary Examiner*—Lincoln Donovan
*Assistant Examiner*—Ryan C Jager (57) ABSTRACT

A compensated control circuit includes a combination module that generates a control variable based on n signals and a process module that generates an output signal based on an input signal and the control variable wherein n is a positive integer.

26 Claims, 10 Drawing Sheets

FIG. 10G

PROFILE CIRCUIT CONTROL FUNCTION

FIELD

The present disclosure relates to compensation circuits.

BACKGROUND

The background description provided herein is for the purpose of generally presenting the context of the disclosure. Work of the presently named inventors, to the extent it is described in this background section, as well as aspects of the description that may not otherwise qualify as prior art at the time of filing, are neither expressly nor impliedly admitted as prior art against the present disclosure.

Figure 1:
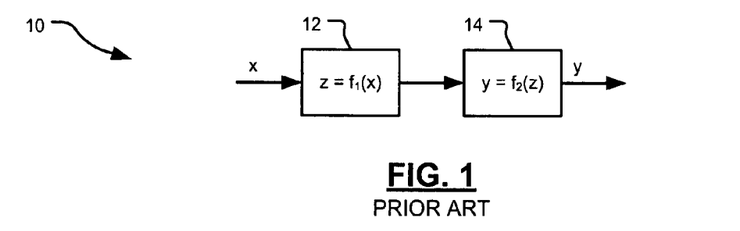
FIG. 1 is a functional block diagram of an amplifier in accordance with the prior art.

Referring now to FIG. 1, an amplifier 10 includes a first module 12 that can be characterized by a first transfer function $z=f_1(x)$, where x is an independent variable such as frequency, current, voltage, and the like, and z is an output signal. The amplifier 10 includes a second module 14 that can be characterized by a second transfer function $y=f_2(z)$, where y is a dependent variable such as frequency, current, voltage, and the like. At least one of the first function $f_1$ and the second function $f_2$ may be non-linear and/or dependent on a third independent variable, such as time, temperature, and the like. Therefore, it can be challenging to calibrate or otherwise predict an overall total transfer function $y=f(x)$ of amplifier 10 as the third variable changes.

Figure 2A:
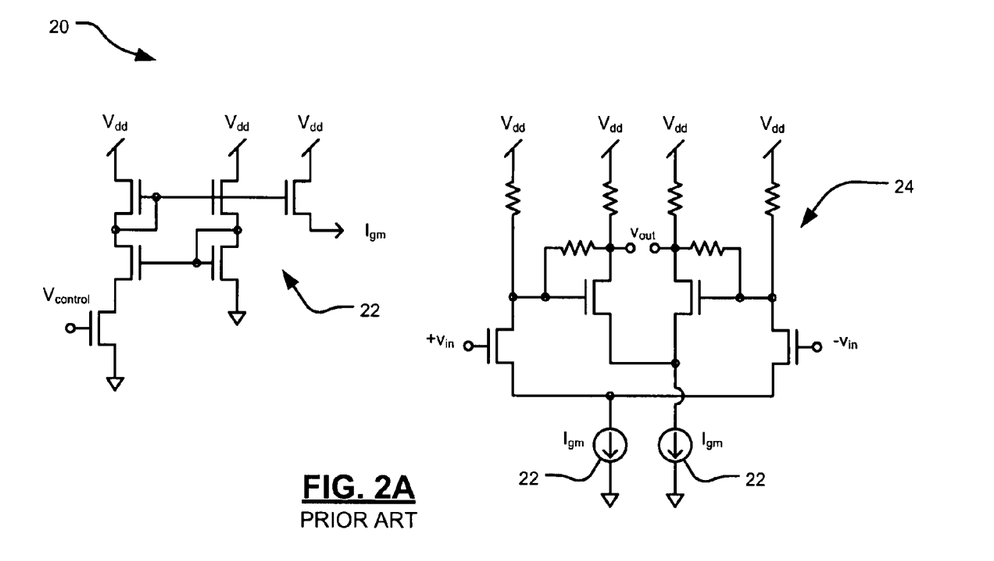
FIG. 2A is a schematic diagram of a programmable-gain differential amplifier that is constructed in accordance with FIG. 1.
Figure 2B:
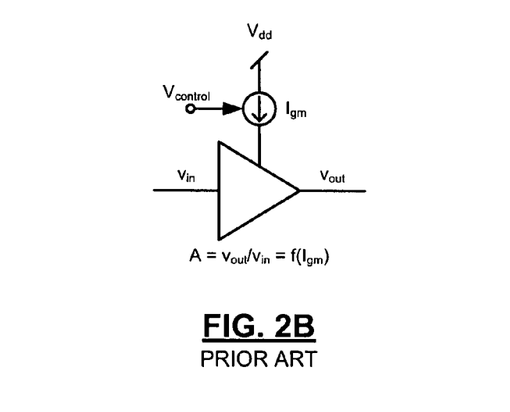
FIG. 2B. is a functional block diagram of the programmable-gain differential amplifier of FIG. 2A.

Referring now to FIG. 2A, a programmable gain amplifier 20 is shown that behaves in accordance with generic amplifier 10 of FIG. 1. A programmable current source 22 corresponds to first module 12 and generates a programming current $I_{gm}$ based on an input signal $V_{control}$. A differential amplifier 24 corresponds to second module 14 and has a gain $A=v_{out}/v_{in}$ that is based on the programming current $I_{gm}$. FIG. 2B shows a functional block diagram of programmable gain amplifier 20.

Figure 2C:
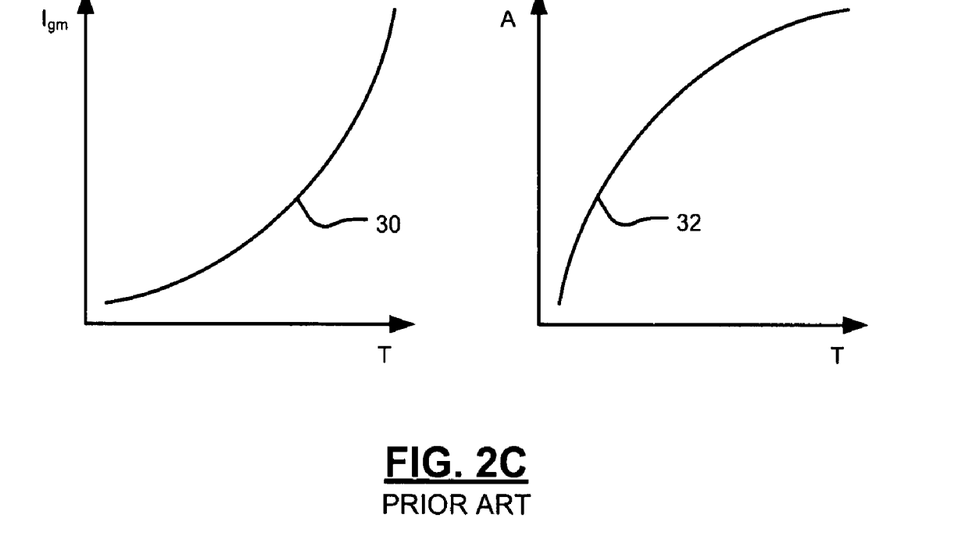
FIG. 2C is a plurality of gain plots of a current source module and a gain module of the amplifier of FIGS. 2A and 2B.

Referring now to FIG. 2C, a first plot 30 shows an unscaled characteristic curve of programmable current source 22 and a second plot 32 shows an unscaled characteristic curve of differential amplifier 24. First plot 30 shows that if all other variables are held constant, then the programming current $I_{gm}$ is more sensitive to temperature changes at higher temperatures T than at lower temperatures T. Second plot 32 shows that if all other variables are held constant, then the gain A is more sensitive to temperature changes at lower temperatures than at higher temperatures. The opposite characteristics of these temperature sensitivities can make it challenging to control the gain of amplifier 20 as its temperature varies.

SUMMARY

A compensated control circuit includes a combination module that generates a control variable based on n signals and a process module that generates an output signal based on an input signal and the control variable wherein n is a positive integer.

In other features the n signals represent n parameters. At least one of the parameters is selected from the group consisting of time, temperature, frequency, and process. The control variable effects a predetermined relationship between the input signal and the output signal of the process module.

A programmable gain amplifier includes a current source that generates a first current based on a first transfer function and a voltage amplifier that receives an input voltage signal and generates an output voltage signal based on a gain A. The gain A is based on a control current and a second transfer function. A compensation module generates the control current based on the first current and a mapping function. The mapping function is based on the first transfer function and the second transfer function to reduce the effect of an independent variable on an overall transfer function that relates the first current to the gain A.

In other features the current source includes an input that receives a signal and the first current is further based on the signal. The independent variable is temperature. At least one of the first transfer function and the second transfer function is a non-linear function. The first transfer function relates the first current to an independent variable. The second transfer function relates the gain A to the independent variable. The gain is substantially independent of the first current. The relationship between the first current and the gain is substantially linear. The mapping function is based on piecewise-polynomial approximations of the first transfer function and the second transfer function.

In other features the compensation module includes an opamp that generates a gate drive signal based on the first current and a transistor that conducts the control current based on the gate drive signal. The compensation module implements a linear transfer function of the form $y=mx+p$, where y is the control current, x is the first current, m is a slope and p is an intercept point. The compensation module further comprises a third current source that generates an offset current that passes through the transistor and wherein p is based on the offset current. The amplifier includes a first resistance and a second resistance that communicate with the opamp. The variable m is based on a ratio of the first resistance and the second resistance.

A compensated electrical circuit includes a first module that generates a first output signal based on a first transfer function, a second module that generates a second output signal based on a control signal and a second transfer function, and a compensation module that generates the control signal based on the first output signal and a mapping function. The mapping function is based on the first transfer function and the second transfer function to reduce the effect of an independent variable on an overall transfer function that relates the first output signal to the second output signal.

In other features the independent variable is temperature. The first module is one of a voltage source, a current source, and a frequency source. At least one of the first transfer function and the second transfer function is a non-linear function. The first module further generates the first output signal based on a first input signal. The second module further generates the second output signal based on a second input signal.

In other features the mapping function is based on piecewise-polynomial approximations of the first transfer function and the second transfer function. The first transfer function relates the first output signal and the independent variable. The second transfer function relates the second output signal and the independent variable. The overall transfer function is substantially independent of the independent variable. The relationship between the first output signal and the second output signal is substantially linear. The relationship between the first output signal and the second output signal is a polynomial relationship. The first module is a first current source, the first output signal is a first current, the independent variable is temperature, the second module is a voltage amplifier, and the control signal is a control current.

In other features the compensation module includes an opamp that generates a gate drive signal based on the first current and a transistor that conducts the control current based on the gate drive signal. The compensation module implements a linear transfer function of the form y=mx+p, where y is the control current, x is the first current, m is a slope and p is an intercept point. The compensation module further comprises a third current source that generates an offset current that passes through the transistor. The variable p is based on the offset current. The circuit includes a first resistance and a second resistance that communicate with the opamp. The variable m is based on a ratio of the first resistance and the second resistance.

A method for compensating a control circuit includes generating a control variable based on n signals and generating an output signal based on an input signal and the control variable wherein n is a positive integer.

In other features the n signals represent n parameters. At least one of the parameters is selected from the group consisting of time, temperature, frequency, and process. The control variable effects a predetermined relationship between the input signal and the output signal.

A method for operating a programmable gain amplifier includes generating a first current based on a first transfer function and receiving an input voltage signal and generating an output voltage signal based on a gain A. The gain A is based on a control current and a second transfer function. The method includes generating the control current based on the first current and a mapping function. The mapping function is based on the first transfer function and the second transfer function to reduce the effect of an independent variable on an overall transfer function that relates the first current to the gain A.

In other features the method includes receiving a signal and the first current is further based on the signal. The independent variable is temperature. At least one of the first transfer function and the second transfer function is a non-linear function. The first transfer function relates the first current to an independent variable. The second transfer function relates the gain A to the independent variable. The gain is substantially independent of the first current. The relationship between the first current and the gain is substantially linear. The mapping function is based on piecewise-polynomial approximations of the first transfer function and the second transfer function. The mapping function includes generating a gate drive signal based on the first current and conducting the control current based on the gate drive signal. The mapping function implements a linear transfer function of the form y=mx+p, where y is the control current, x is the first current, m is a slope and p is an intercept point. The mapping function further comprises generating an offset current wherein p is based on the offset current. The variable m is based on a ratio of a first resistance and a second resistance.

A method for compensating an electrical circuit includes generating a first output signal based on a first transfer function, generating a second output signal based on a control signal and a second transfer function, and generating the control signal based on the first output signal and a mapping function. The mapping function is based on the first transfer function and the second transfer function to reduce the effect of an independent variable on an overall transfer function that relates the first output signal to the second output signal.

In other features the independent variable is temperature. The first output signal is one of a voltage signal, a current signal, and a frequency signal. At least one of the first transfer function and the second transfer function is a non-linear function. The method includes generating the first output signal based on a first input signal and generating the second output signal based on a second input signal. The mapping function is based on piecewise-polynomial approximations of the first transfer function and the second transfer function. The first transfer function relates the first output signal and the independent variable. The second transfer function relates the second output signal and the independent variable. The overall transfer function is substantially independent of the independent variable. The relationship between the first output signal and the second output signal is substantially linear. The relationship between the first output signal and the second output signal is a polynomial relationship. The first output signal is a first current, the independent variable is a temperature and the control signal is a control current. Generating the control current includes generating a gate drive signal based on the first current and conducting the control current based on the gate drive signal.

In other features generating the control current implements a linear transfer function of the form y=mx+p, where y is the control current, x is the first current, m is a slope and p is an intercept point. Generating the control current further comprises generating an offset current wherein p is based on the offset current. The variable m is based on a ratio of a first resistance and a second resistance.

A compensated control circuit includes combination means for generating a control variable based on n signals and process means for generating an output signal based on an input signal and the control variable wherein n is a positive integer.

The n signals represent n parameters. At least one of the parameters is selected from the group consisting of time, temperature, frequency, and process. The control variable effects a predetermined relationship between the input signal and the output signal of the process means.

A programmable gain amplifier includes current source means for generating a first current based on a first transfer function and voltage amplifier means for receiving an input voltage signal and generating an output voltage signal based on a gain A. The gain A is based on a control current and a second transfer function. Compensation means generate the control current based on the first current and a mapping function. The mapping function is based on the first transfer function and the second transfer function to reduce the effect of an independent variable on an overall transfer function that relates the first current to the gain A.

In other features the current source means includes an input that receives a signal and the first current is further based on the signal. The independent variable is temperature. At least one of the first transfer function and the second transfer function is a non-linear function. The first transfer function relates the first current to an independent variable. The second transfer function relates the gain A to the independent variable. The gain is substantially independent of the first current. The relationship between the first current and the gain is substantially linear. The mapping function is based on piecewise-polynomial approximations of the first transfer function and the second transfer function.

In other features the compensation means includes opamp means for generating a gate drive signal based on the first current and transistor means for conducting the control current based on the gate drive signal. The compensation means implements a linear transfer function of the form y=mx+p, where y is the control current, x is the first current, m is a slope and p is an intercept point. The compensation means further comprises a third current source that generates an offset current that passes through the transistor means and wherein p is based on the offset current. The amplifier includes first resistance means for providing a first resistance and second resistance means for providing a second resistance that communicate with the opamp means. The variable m is based on a ratio of the first resistance and the second resistance.

A compensated electrical circuit includes first means for generating a first output signal based on a first transfer function, second means for generating a second output signal based on a control signal and a second transfer function, and compensation means for generating the control signal based on the first output signal and a mapping function. The mapping function is based on the first transfer function and the second transfer function to reduce the effect of an independent variable on an overall transfer function that relates the first output signal to the second output signal.

In other features the independent variable is temperature. The first means includes one of a voltage source, a current source, and a frequency source. At least one of the first transfer function and the second transfer function is a non-linear function. The first means further generates the first output signal based on a first input signal. The second means further generates the second output signal based on a second input signal. The mapping function is based on piecewise-polynomial approximations of the first transfer function and the second transfer function. The first transfer function relates the first output signal and the independent variable. The second transfer function relates the second output signal and the independent variable. The overall transfer function is substantially independent of the independent variable. The relationship between the first output signal and the second output signal is substantially linear. The relationship between the first output signal and the second output signal is a polynomial relationship. The first means includes a first current source, the first output signal is a first current, the independent variable is temperature, the second means is a voltage amplifier, and the control signal is a control current.

In other features the compensation means includes opamp means for generating a gate drive signal based on the first current and transistor means for conducting the control current based on the gate drive signal. The compensation means implements a linear transfer function of the form y=mx+p, where y is the control current, x is the first current, m is a slope and p is an intercept point. The compensation means further comprises third current source means for generating an offset current that passes through the transistor means and wherein p is based on the offset current. The circuit includes first resistance means for providing a first resistance and second resistance means for providing a second resistance. The variable m is based on a ratio of the first resistance and the second resistance.

A computer program for compensating a control circuit is executed by one or more processors. The computer program can reside on a computer readable medium such as but not limited to memory, non-volatile data storage and/or other suitable tangible storage mediums. The computer program includes generating a control variable based on n signals and generating an output signal based on an input signal and the control variable wherein n is a positive integer.

In other features the n signals represent n parameters. At least one of the parameters is selected from the group consisting of time, temperature, frequency, and process. The control variable effects a predetermined relationship between the input signal and the output signal.

A computer program for operating a programmable gain amplifier is executed by one or more processors. The computer program can reside on a computer readable medium such as but not limited to memory, non-volatile data storage and/or other suitable tangible storage mediums. The computer program includes generating a first current based on a first transfer function and receiving an input voltage signal and generating an output voltage signal based on a gain A. The gain A is based on a control current and a second transfer function. The computer program includes generating the control current based on the first current and a mapping function. The mapping function is based on the first transfer function and the second transfer function to reduce the effect of an independent variable on an overall transfer function that relates the first current to the gain A.

In other features the computer program includes receiving a signal and the first current is further based on the signal. The independent variable is temperature. At least one of the first transfer function and the second transfer function is a non-linear function. The first transfer function relates the first current to an independent variable. The second transfer function relates the gain A to the independent variable. The gain is substantially independent of the first current. The relationship between the first current and the gain is substantially linear. The mapping function is based on piecewise-polynomial approximations of the first transfer function and the second transfer function. The mapping function includes generating a gate drive signal based on the first current and conducting the control current based on the gate drive signal. The mapping function implements a linear transfer function of the form y=mx+p, where y is the control current, x is the first current, m is a slope and p is an intercept point. The mapping function further comprises generating an offset current wherein p is based on the offset current. The variable m is based on a ratio of a first resistance and a second resistance.

A computer program for compensating an electrical circuit is executed by one or more processors. The computer program can reside on a computer readable medium such as but not limited to memory, non-volatile data storage and/or other suitable tangible storage mediums. The computer program includes generating a first output signal based on a first transfer function, generating a second output signal based on a control signal and a second transfer function, and generating the control signal based on the first output signal and a mapping function. The mapping function is based on the first transfer function and the second transfer function to reduce the effect of an independent variable on an overall transfer function that relates the first output signal to the second output signal.

In other features the independent variable is temperature. The first output signal is one of a voltage signal, a current signal, and a frequency signal. At least one of the first transfer function and the second transfer function is a non-linear function. The computer program includes generating the first output signal based on a first input signal and generating the second output signal based on a second input signal. The mapping function is based on piecewise-polynomial approximations of the first transfer function and the second transfer function. The first transfer function relates the first output signal and the independent variable. The second transfer function relates the second output signal and the independent variable. The overall transfer function is substantially independent of the independent variable. The relationship between the first output signal and the second output signal is substantially linear. The relationship between the first output signal and the second output signal is a polynomial relationship. The first output signal is a first current, the independent variable is a temperature and the control signal is a control current. Generating the control current includes generating a gate drive signal based on the first current and conducting the control current based on the gate drive signal.

In other features generating the control current implements a linear transfer function of the form y=mx+p, where y is the control current, x is the first current, m is a slope and p is an intercept point. Generating the control current further comprises generating an offset current wherein p is based on the offset current. The variable m is based on a ratio of a first resistance and a second resistance.

Further areas of applicability of the present disclosure will become apparent from the detailed description provided hereinafter. It should be understood that the detailed description and specific examples, while indicating the preferred embodiment of the disclosure, are intended for purposes of illustration only and are not intended to limit the scope of the disclosure.

BRIEF DESCRIPTION OF THE DRAWINGS

The present disclosure will become more fully understood from the detailed description and the accompanying drawings, wherein.

DETAILED DESCRIPTION

The following description is merely exemplary in nature and is in no way intended to limit the disclosure, its application, or uses. For purposes of clarity, the same reference numbers will be used in the drawings to identify similar elements. As used herein, the term module refers to an Application Specific Integrated Circuit (ASIC), an electronic circuit, a processor (shared, dedicated, or group) and memory that execute one or more software or firmware programs, a combinational logic circuit, and/or other suitable components that provide the described functionality. As used herein, the phrase at least one of A, B, and C should be construed to mean a logical (A or B or C), using a non-exclusive logical or. It should be understood that steps within a method may be executed in different order without altering the principles of the present disclosure.

Figure 3:
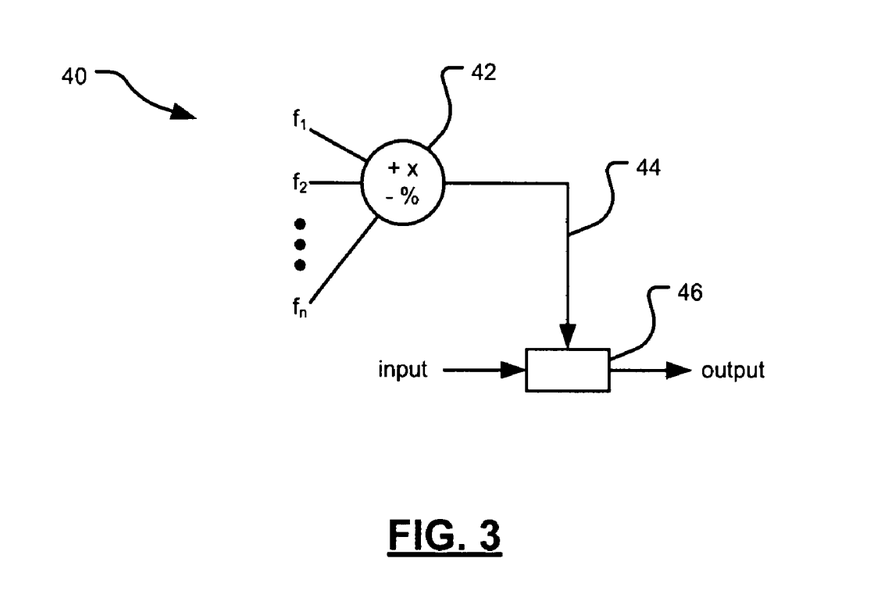
FIG. 3 is a functional block diagram of a compensated control circuit.

Referring now to FIG. 3, a compensated control circuit 40 is shown. Control circuit 40 receives signals from n functions $f_1, f_2, \ldots, f_n$, where each function depends on a different variable and n is the number of functions of interest. Examples of variables include time, temperature, frequency, process, and the like. A combination module 42 employs mathematical operations to generate a control variable 44 based on the signals from the functions $f_1, \ldots, f_n$. A process module 46 generates an output signal based on an input signal and control variable 44. The mathematical operations that are employed by combination module 42 are chosen so that control variable 44 effects a relationship between the input and the output of process module 46 and causes the relationship to behave substantially similar to a predetermined relationship. For example, the predetermined relationship can be substantially independent on one or more of the signals from the functions $f_1, \ldots, f_n$ and substantially linearly related to control variable 44. It should be appreciated that other combinations of relationships, including polynomial relationships, are equally possible.

Figure 4:
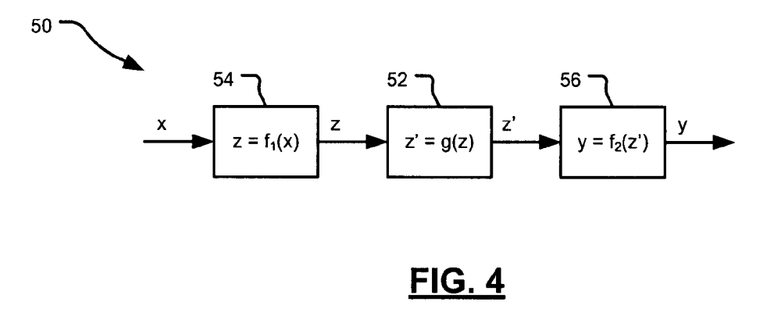
FIG. 4 is a functional block diagram of an amplifier that includes a compensation circuit.

Referring now to FIG. 4, a functional block diagram is shown of a compensated amplifier 50. A compensation module 52 couples between an output of a first module 54 and an input of a second module 56. First module 54 can be characterized by a first transfer function $z=f_1(x)$, where x is an independent variable such as frequency, current, voltage, and the like, and z is an output signal. Second module 56 can be characterized by a second transfer function $y=f_2(z')$, where y is a dependent variable such as frequency, current, voltage, and the like. Compensation module 52 is designed to provide an intermediate transfer function $z'=g(z)$. The intermediate transfer function is chosen such that an overall transfer function $y=f(x)$ of compensated amplifier 50 matches a predetermined polynomial function despite at least one of the first transfer function $f_1(x)$ and the second transfer function $f_2(z')$ being non-linear and dependent on a third independent variable. Examples of the independent variable include time, temperature, and the like. The predetermined polynomial function can also be a linear function.

Figure 5:
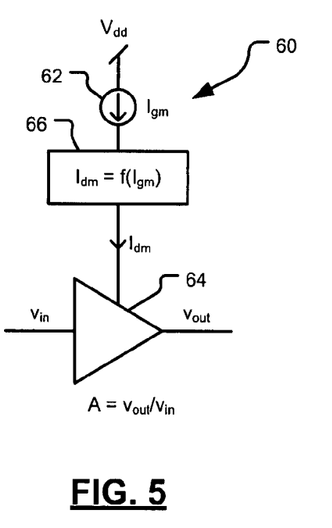
FIG. 5 is a functional block diagram of a first embodiment of the amplifier of FIG. 3.

Referring now to FIG. 5, a programmable gain amplifier 60 is shown that behaves in accordance with amplifier 50 of FIG. 3. A current source 62 corresponds with first module 54 and generates a programming current $I_{gm}$.

Programming current $I_{gm}$ indicates an overall gain of programmable gain amplifier 60. A voltage amplifier 64 corresponds with second module 56 and has a gain $A=v_{out}/v_{in}$ that is based on a compensated programming current $I_{dm}$.

A compensation circuit 66 generates the compensated programming current $I_{dm}$ based on the programming current $I_{gm}$ and a mapping or transfer function. The mapping function of compensation circuit 66 is chosen such that an overall transfer function of programmable gain amplifier 60 matches a predetermined polynomial function. The predetermined polynomial function can be a linear function. The mapping function effectively maps a transfer function of current source 62 to a transfer function of voltage amplifier 64. The mapping function can be generated and implemented using methods that are described below.

Figure 6:
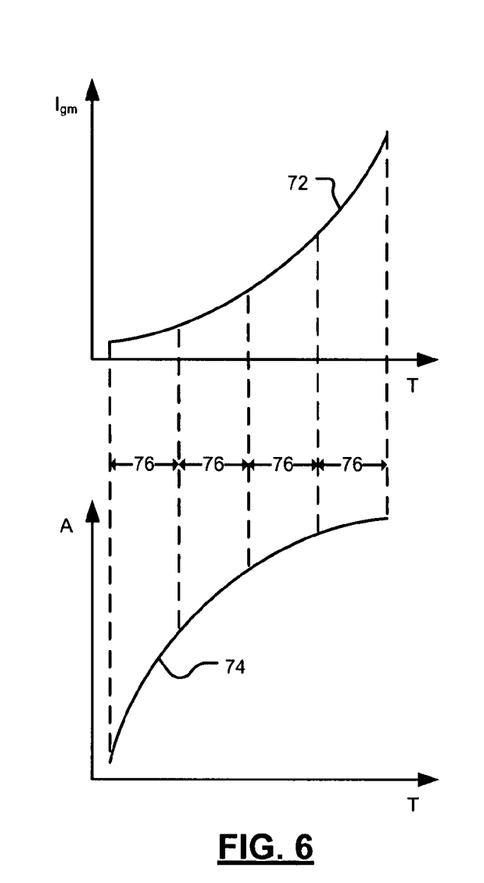
FIG. 6 is a plurality of gain plots of various modules of the amplifier of FIG. 4 without compensation.

Referring now to FIG. 6, a first plot 72 shows a transfer function for current source 62. The horizontal axis represents temperature T and the vertical axis represents the magnitude of programming current $I_{gm}$. First plot 72 shows that when all other variables are held constant then the programming current $I_{gm}$ is more sensitive to temperature changes at higher temperatures than at lower temperatures.

A second plot 74 shows a transfer function for voltage amplifier 64 when the mapping function of compensation circuit 66 provides unity gain. The horizontal axis represents temperature T and the vertical axis represents the gain A. Second plot 74 shows that when all other variables are held constant then the gain A is more sensitive to temperature changes at lower temperatures than at higher temperatures.

Compensation circuit 66 compensates for the effects of temperature on the output signals of current source 62 and voltage amplifier 64. The mapping function of compensation circuit 66 can be derived by choosing a function that maps first plot 72 onto second plot 74. The mapping function can be simplified by dividing first plot 72 and second plot 74 into a plurality of intervals 76 and then approximating first plot 72 and second plot 74 in each interval 76. If the approximations are linear then the mapping function then assumes the form of a point-slope equation over each interval 76. The approximations can also be polynomial approximations, where a lowest-order polynomial approximation is the linear approximation.

Figure 7:
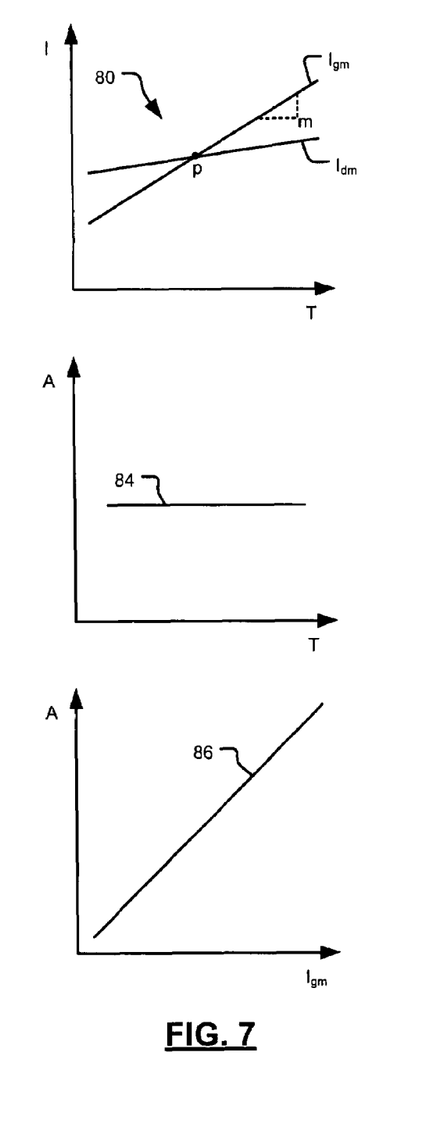
FIG. 7 is a plurality of gain plots of various modules of the amplifier of FIG. 4.

Referring now to FIG. 7, a third plot 80 shows transfer functions between the temperature T and the compensated current $I_{dm}$, and between the temperature T and the programming current $I_{gm}$. Third plot 80 includes a point p at an intersection of the transfer functions and a slope m that can be adjusted to translate and rotate the programming current $I_{gm}$ to a desired position. Compensation circuit 66 (FIG. 4) includes features that adjust the point p and slope m.

A fourth plot 84 shows an ideal transfer function between the temperature T and the gain A after the point p and slope m are adjusted with compensation circuit 66. Fourth plot 84 shows that the gain A is independent of the temperature T after compensation circuit 66 is adjusted. A fifth plot 86 shows the overall gain of programmable gain amplifier 60 after compensation circuit 66 is adjusted. Fifth plot 86 shows a linear relationship between the gain A and the programming current $I_{gm}$.

Figure 8:
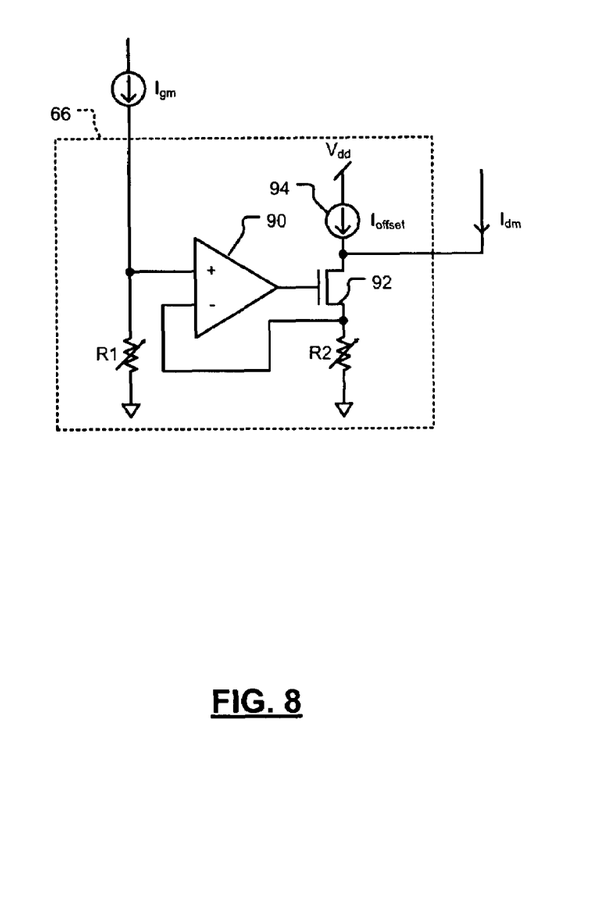
FIG. 8 is a schematic diagram of the compensation circuit of FIG. 3.

Referring now to FIG. 8, a schematic diagram is shown of an analog embodiment of compensation circuit 66. It should be appreciated that the mapping function that compensation circuit 66 provides can also be implemented with an analog-to-digital converter, a digital-to-analog converter, a processor, and a computer program that implements the mapping function.

The programming current $I_{gm}$ flows through a first adjustable resistor R1. One end of resistor R1 communicates with a non-inverting input of an operational amplifier (opamp) 90. The other end of resistor R1 communicates with a reference voltage such as ground. An output of opamp 90 drives a gate of a transistor 92. A source of transistor 92 communicates with one end of a second adjustable resistor R2 and an inverting input of opamp 90. A drain of transistor 92 communicates with a current source that provides an offset current $I_{offset}$. The other end of resistor R2 communicates with the reference voltage. The compensated current $I_{dm}$ can be taken at the drain of transistor 92.

The location of point p, which is shown in third plot 80 of the mapping function, can be varied by changing the magnitude of $I_{offset}$. The slope m of the mapping function can be varied by changing the resistance ratio between resistance R1 and resistance R2.

Figure 9:
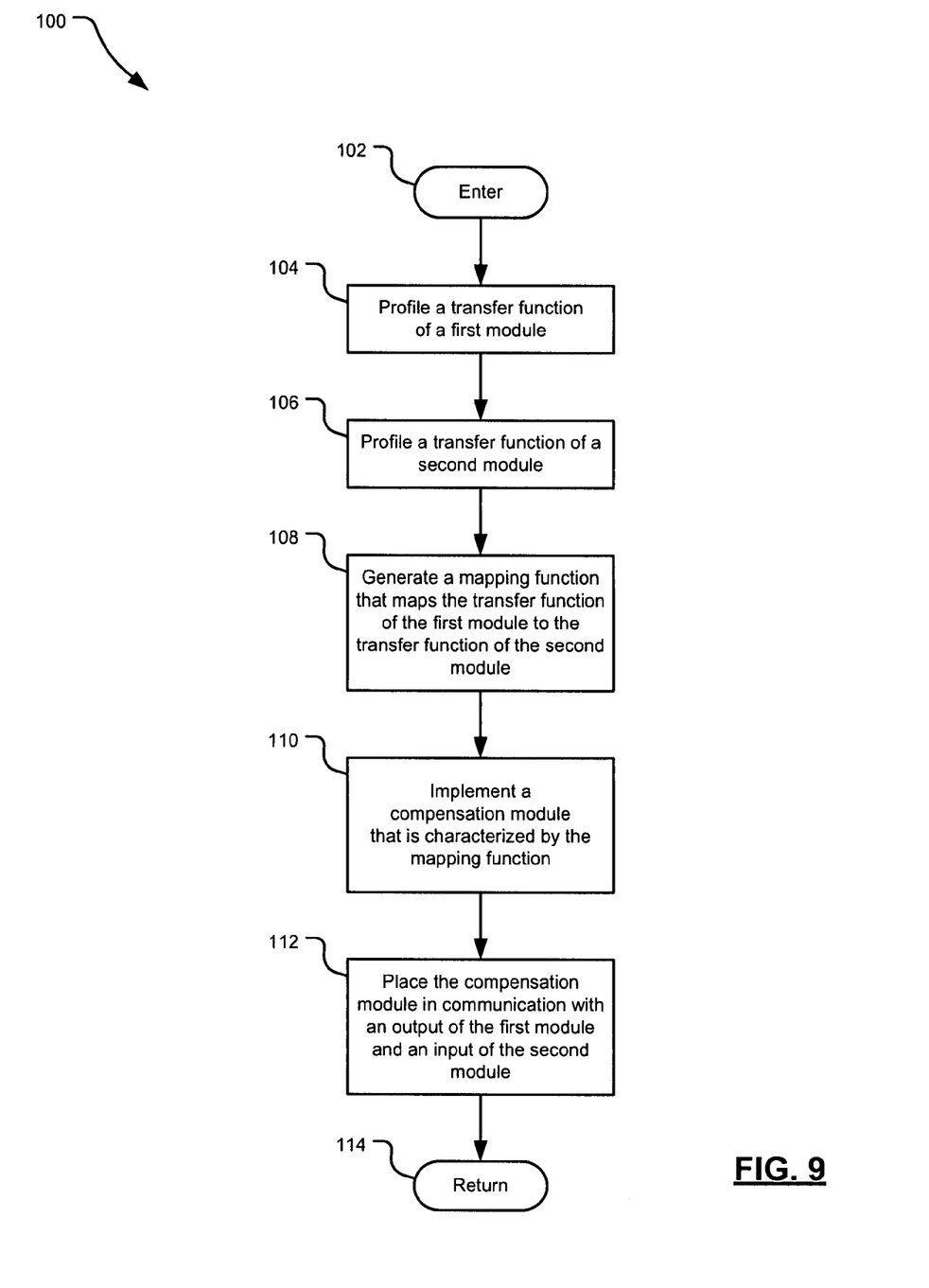
FIG. 9 is a flowchart of a method for designing the compensation circuit of FIG. 3.

Referring now to FIG. 9, a method 100 is shown that can be employed to generate the mapping function and implement compensation module 52 as shown in FIG. 3. Control begins through start block 102 and immediately proceeds to block 104. In block 104 control profiles the transfer function of first module 54. Control then proceeds to block 106 and profiles the transfer function of second module 56. Control then proceeds to block 108 and generates a mapping function that maps the transfer function of first module 54 onto the transfer function of second module 56.

Control then proceeds to block 110 and implements a compensation module that is characterized by the mapping function. Control then proceeds to block 112 and places an output of first module 54 in communication with an input of compensation module 52 and places an output of compensation module 52 in communication with an input of second module 56.

Referring now to FIGS. 10A-10G, various exemplary implementations incorporating the teachings of the present disclosure are shown.

Figure 10A:
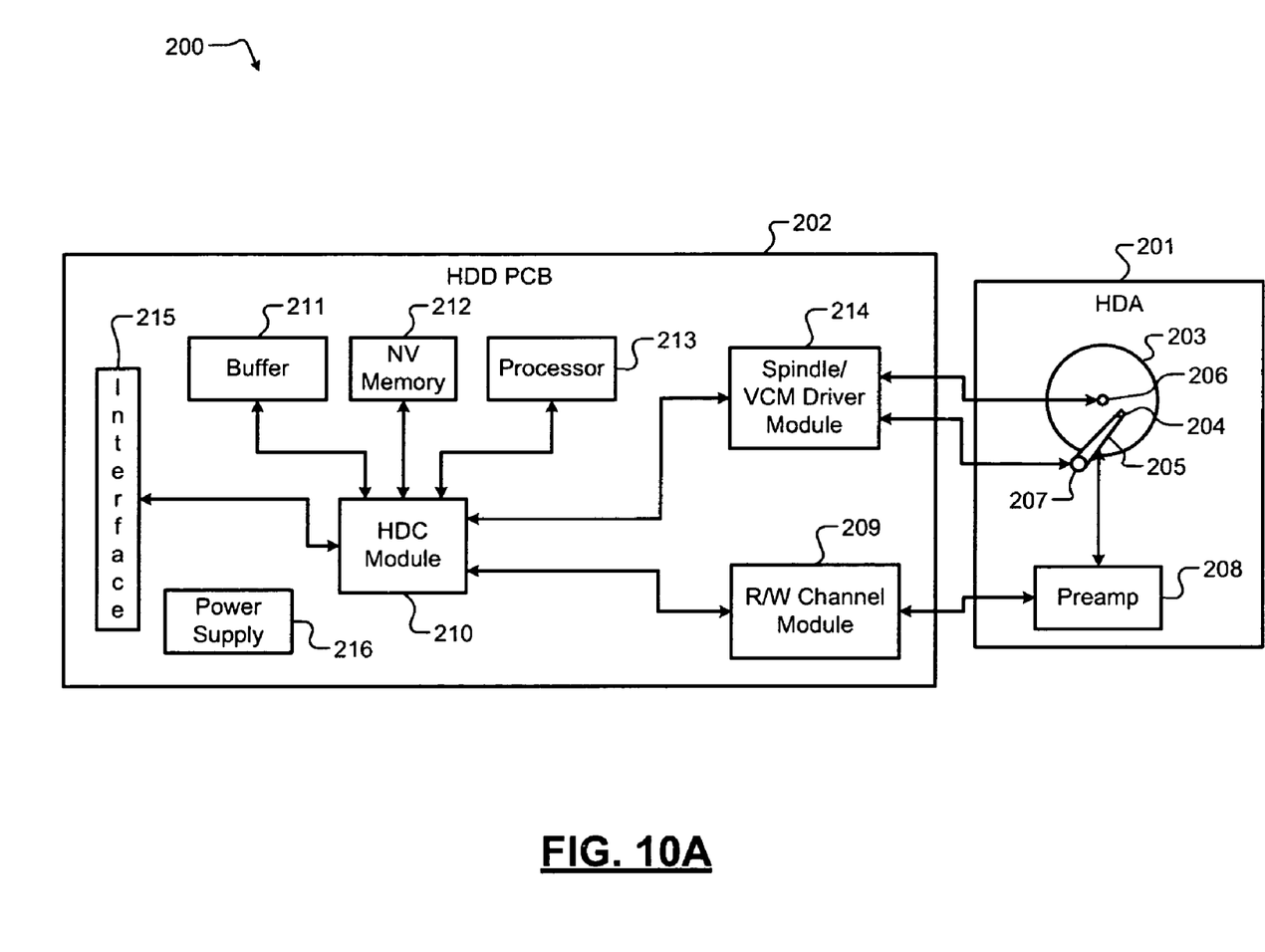
FIG. 10A is a functional block diagram of a hard disk drive.

Referring now to FIG. 9A, the teachings of the disclosure can be implemented in a preamplifier device 208 of a hard disk drive (HDD) 200. The HDD 200 includes a hard disk assembly (HDA) 201 and a HDD PCB 202. The HDA 201 may include a magnetic medium 203, such as one or more platters that store data, and a read/write device 204. The read/write device 204 may be arranged on an actuator arm 205 and may read and write data on the magnetic medium 203. Additionally, the HDA 201 includes a spindle motor 206 that rotates the magnetic medium 203 and a voice-coil motor (VCM) 207 that actuates the actuator arm 205. The preamplifier device 208 amplifies signals generated by the read/write device 204 during read operations and provides signals to the read/write device 204 during write operations.

The HDD PCB 202 includes a read/write channel module (hereinafter, "read channel") 209, a hard disk controller (HDC) module 210, a buffer 211, nonvolatile memory 212, a processor 213, and a spindle/VCM driver module 214. The read channel 209 processes data received from and transmitted to the preamplifier device 208. The HDC module 210 controls components of the HDA 201 and communicates with an external device (not shown) via an I/O interface 215. The external device may include a computer, a multimedia device, a mobile computing device, etc. The I/O interface 215 may include wireline and/or wireless communication links.

The HDC module 210 may receive data from the HDA 201, the read channel 209, the buffer 211, nonvolatile memory 212, the processor 213, the spindle/VCM driver module 214, and/or the I/O interface 215. The processor 213 may process the data, including encoding, decoding, filtering, and/or formatting. The processed data may be output to the HDA 201, the read channel 209, the buffer 211, nonvolatile memory 212, the processor 213, the spindle/VCM driver module 214, and/or the I/O interface 215.

The HDC module 210 may use the buffer 211 and/or nonvolatile memory 212 to store data related to the control and operation of the HDD 200. The buffer 211 may include DRAM, SDRAM, etc. The nonvolatile memory 212 may include flash memory (including NAND and NOR flash memory), phase change memory, magnetic RAM, or multi-state memory, in which each memory cell has more than two states. The spindle/VCM driver module 214 controls the spindle motor 206 and the VCM 207. The HDD PCB 202 includes a power supply 216 that provides power to the components of the HDD 200.

Figure 10B:
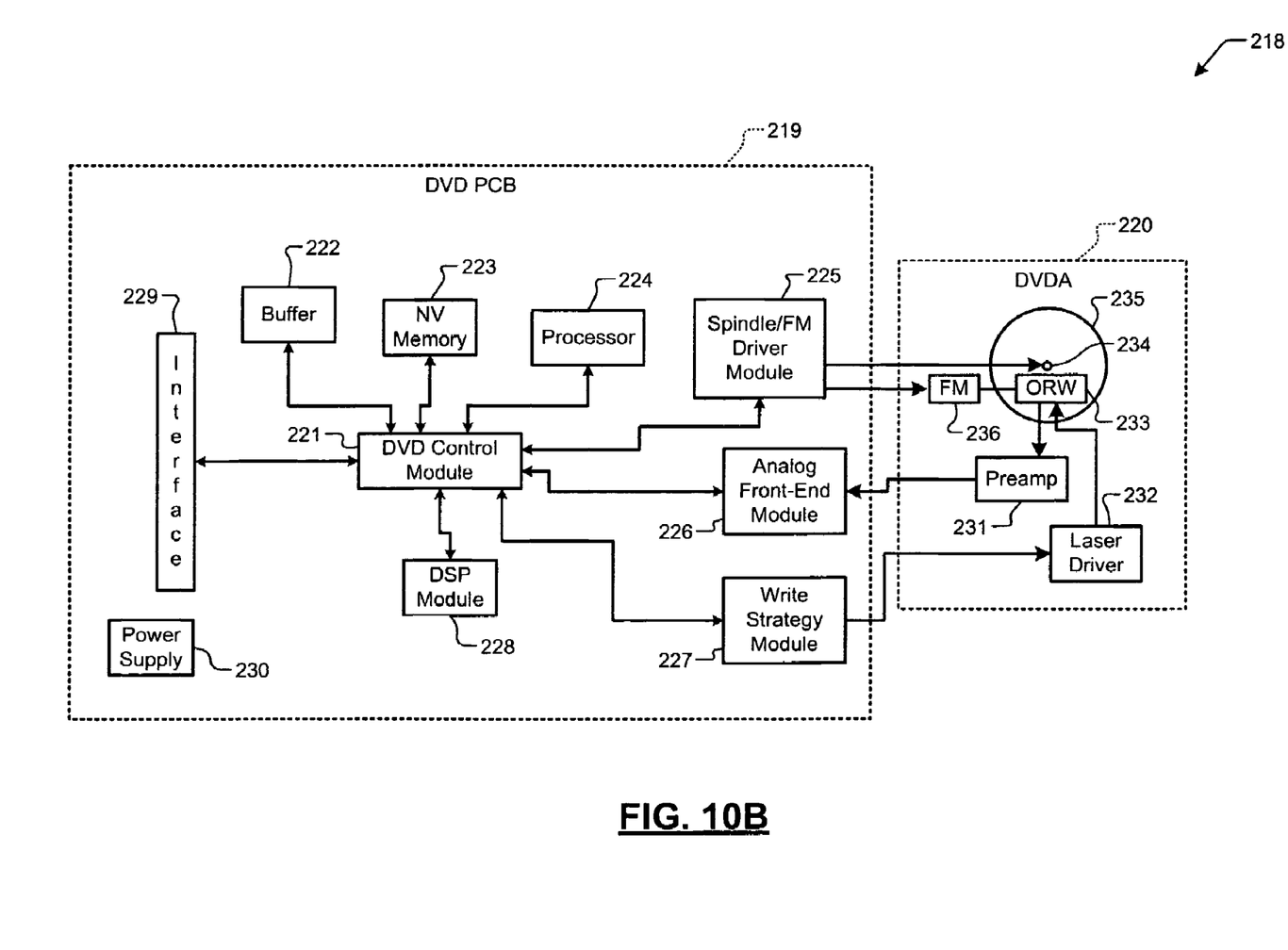
FIG. 10B is a functional block diagram of a DVD drive.

Referring now to FIG. 10B, the teachings of the disclosure can be implemented in the preamplifier device 231 of a DVD drive 218 or of a CD drive (not shown). The DVD drive 218 includes a DVD PCB 219 and a DVD assembly (DVDA) 220. The DVD PCB 219 includes a DVD control module 221, a buffer 222, nonvolatile memory 223, a processor 224, a spindle/FM (feed motor) driver module 225, an analog front-end module 226, a write strategy module 227, and a DSP module 228.

The DVD control module 221 controls components of the DVDA 220 and communicates with an external device (not shown) via an I/O interface 229. The external device may include a computer, a multimedia device, a mobile computing device, etc. The I/O interface 229 may include wireline and/or wireless communication links.

The DVD control module 221 may receive data from the buffer 222, nonvolatile memory 223, the processor 224, the spindle/FM driver module 225, the analog front-end module 226, the write strategy module 227, the DSP module 228, and/or the I/O interface 229. The processor 224 may process the data, including encoding, decoding, filtering, and/or formatting. The DSP module 228 performs signal processing, such as video and/or audio coding/decoding. The processed data may be output to the buffer 222, nonvolatile memory 223, the processor 224, the spindle/FM driver module 225, the analog front-end module 226, the write strategy module 227, the DSP module 228, and/or the I/O interface 229.

The DVD control module 221 may use the buffer 222 and/or nonvolatile memory 223 to store data related to the control and operation of the DVD drive 218. The buffer 222 may include DRAM, SDRAM, etc. The nonvolatile memory 223 may include flash memory (including NAND and NOR flash memory), phase change memory, magnetic RAM, or multi-state memory, in which each memory cell has more than two states. The DVD PCB 219 includes a power supply 230 that provides power to the components of the DVD drive 218.

The DVDA 220 may include a preamplifier device 231, a laser driver 232, and an optical device 233, which may be an optical read/write (ORW) device or an optical read-only (OR) device. A spindle motor 234 rotates an optical storage medium 235, and a feed motor 236 actuates the optical device 233 relative to the optical storage medium 235.

When reading data from the optical storage medium 235, the laser driver provides a read power to the optical device 233. The optical device 233 detects data from the optical storage medium 235, and transmits the data to the preamplifier device 231. The analog front-end module 226 receives data from the preamplifier device 231 and performs such functions as filtering and A/D conversion. To write to the optical storage medium 235, the write strategy module 227 transmits power level and timing information to the laser driver 232. The laser driver 232 controls the optical device 233 to write data to the optical storage medium 235.

Figure 10C:
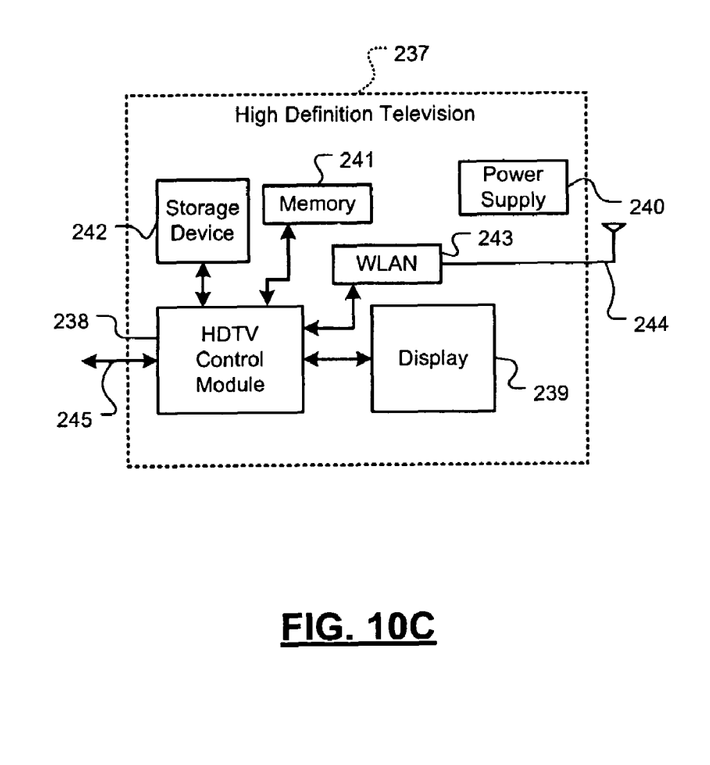
FIG. 10C is a functional block diagram of a high definition television.

Referring now to FIG. 10C, the teachings of the disclosure can be implemented in amplifiers of a high definition television (HDTV) control module 238. A HDTV 237 includes the HDTV control module 238, a display 239, a power supply 240, memory 241, a storage device 242, a WLAN interface 243 and associated antenna 244, and an external interface 245.

The HDTV 237 can receive input signals from the WLAN interface 243 and/or the external interface 245, which sends and receives information via cable, broadband Internet, and/or satellite. The HDTV control module 238 may process the input signals, including encoding, decoding, filtering, and/or formatting, and generate output signals. The output signals may be communicated to one or more of the display 239, memory 241, the storage device 242, the WLAN interface 243, and the external interface 245.

Memory 241 may include random access memory (RAM) and/or nonvolatile memory such as flash memory, phase change memory, or multi-state memory, in which each memory cell has more than two states. The storage device 242 may include an optical storage drive, such as a DVD drive, and/or a hard disk drive (HDD). The HDTV control module 238 communicates externally via the WLAN interface 243 and/or the external interface 245. The power supply 240 provides power to the components of the HDTV 237.

Figure 10D:
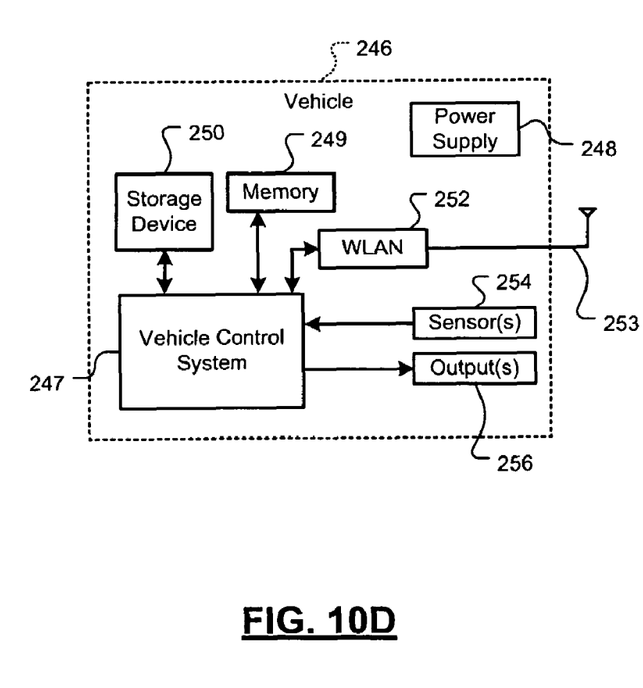
FIG. 10D is a functional block diagram of a vehicle control system.

Referring now to FIG. 10D, the teachings of the disclosure may be implemented in amplifiers of a vehicle control system 247. A vehicle 246 may include the vehicle control system 247, a power supply 248, memory 249, a storage device 250, and a WLAN interface 252 and associated antenna 253. The vehicle control system 247 may be a powertrain control system, a body control system, an entertainment control system, an anti-lock braking system (ABS), a navigation system, a telematics system, a lane departure system, an adaptive cruise control system, etc.

The vehicle control system 247 may communicate with one or more sensors 254 and generate one or more output signals 256. The sensors 254 may include temperature sensors, acceleration sensors, pressure sensors, rotational sensors, airflow sensors, etc. The output signals 256 may control engine operating parameters, transmission operating parameters, suspension parameters, etc.

The power supply 248 provides power to the components of the vehicle 246. The vehicle control system 247 may store data in memory 249 and/or the storage device 250. Memory 249 may include random access memory (RAM) and/or nonvolatile memory such as flash memory, phase change memory, or multi-state memory, in which each memory cell has more than two states. The storage device 250 may include an optical storage drive, such as a DVD drive, and/or a hard disk drive (HDD). The vehicle control system 247 may communicate externally using the WLAN interface 252.

Figure 10E:
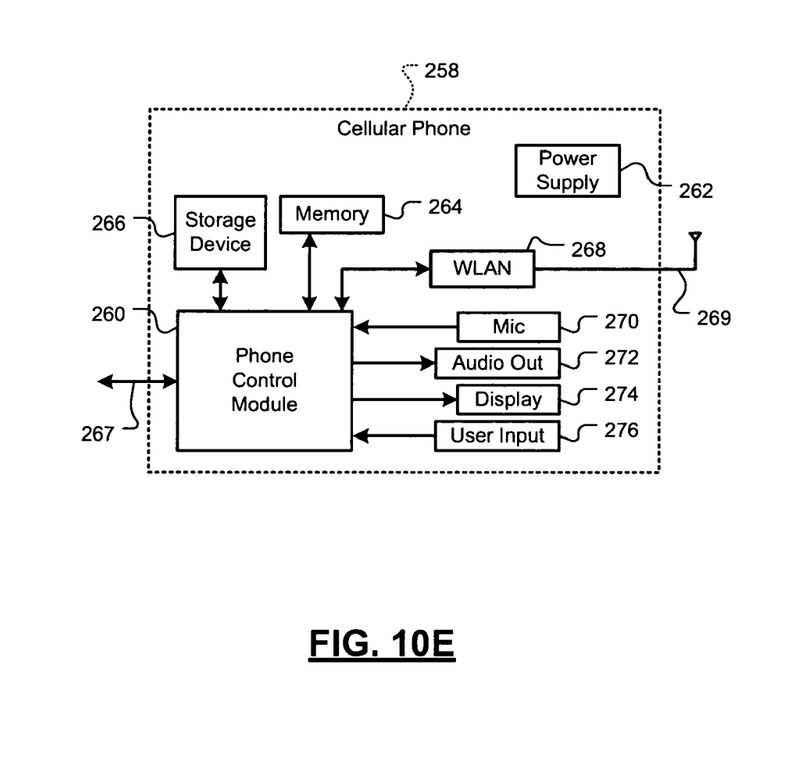
FIG. 10E is a functional block diagram of a cellular phone.

Referring now to FIG. 10E, the teachings of the disclosure can be implemented in amplifiers of a phone control module 260 of a cellular phone 258. The cellular phone 258 includes the phone control module 260, a power supply 262, memory 264, a storage device 266, and a cellular network interface 267. The cellular phone 258 may include a WLAN interface 268 and associated antenna 269, a microphone 270, an audio output 272 such as a speaker and/or output jack, a display 274, and a user input device 276 such as a keypad and/or pointing device.

The phone control module 260 may receive input signals from the cellular network interface 267, the WLAN interface 268, the microphone 270, and/or the user input device 276. The phone control module 260 may process signals, including encoding, decoding, filtering, and/or formatting, and generate output signals. The output signals may be communicated to one or more of memory 264, the storage device 266, the cellular network interface 267, the WLAN interface 268, and the audio output 272.

Memory 264 may include random access memory (RAM) and/or nonvolatile memory such as flash memory, phase change memory, or multi-state memory, in which each memory cell has more than two states. The storage device 266 may include an optical storage drive, such as a DVD drive, and/or a hard disk drive (HDD). The power supply 262 provides power to the components of the cellular phone 258.

Figure 10F:
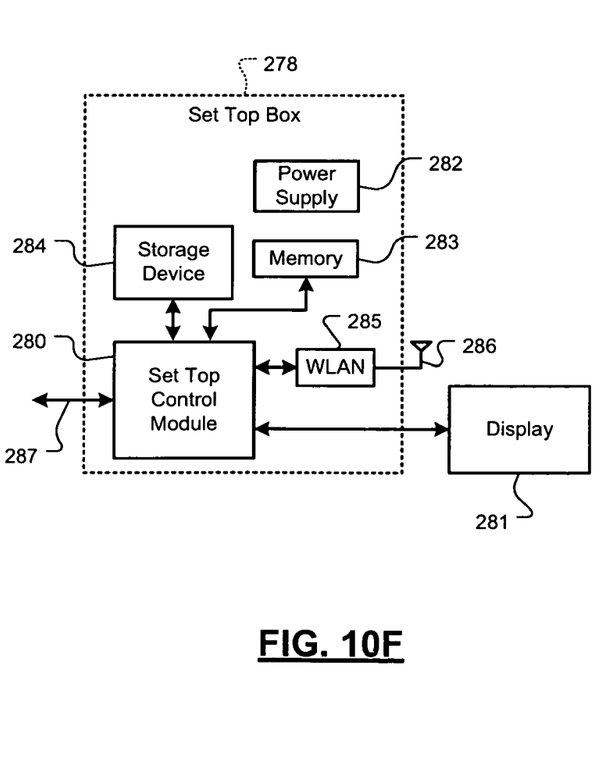
FIG. 10F is a functional block diagram of a set top box.

Referring now to FIG. 10F, the teachings of the disclosure can be implemented in amplifiers of a set top control module 280. A set top box 278 includes the set top control module 280, a display 281, a power supply 282, memory 283, a storage device 284, and a WLAN interface 285 and associated antenna 286.

The set top control module 280 may receive input signals from the WLAN interface 285 and an external interface 287, which can send and receive information via cable, broadband Internet, and/or satellite. The set top control module 280 may process signals, including encoding, decoding, filtering, and/ or formatting, and generate output signals. The output signals may include audio and/or video signals in standard and/or high definition formats. The output signals may be communicated to the WLAN interface 285 and/or to the display 281. The display 281 may include a television, a projector, and/or a monitor.

The power supply 282 provides power to the components of the set top box 278. Memory 283 may include random access memory (RAM) and/or nonvolatile memory such as flash memory, phase change memory, or multi-state memory, in which each memory cell has more than two states. The storage device 284 may include an optical storage drive, such as a DVD drive, and/or a hard disk drive (HDD).

Figure 10G:
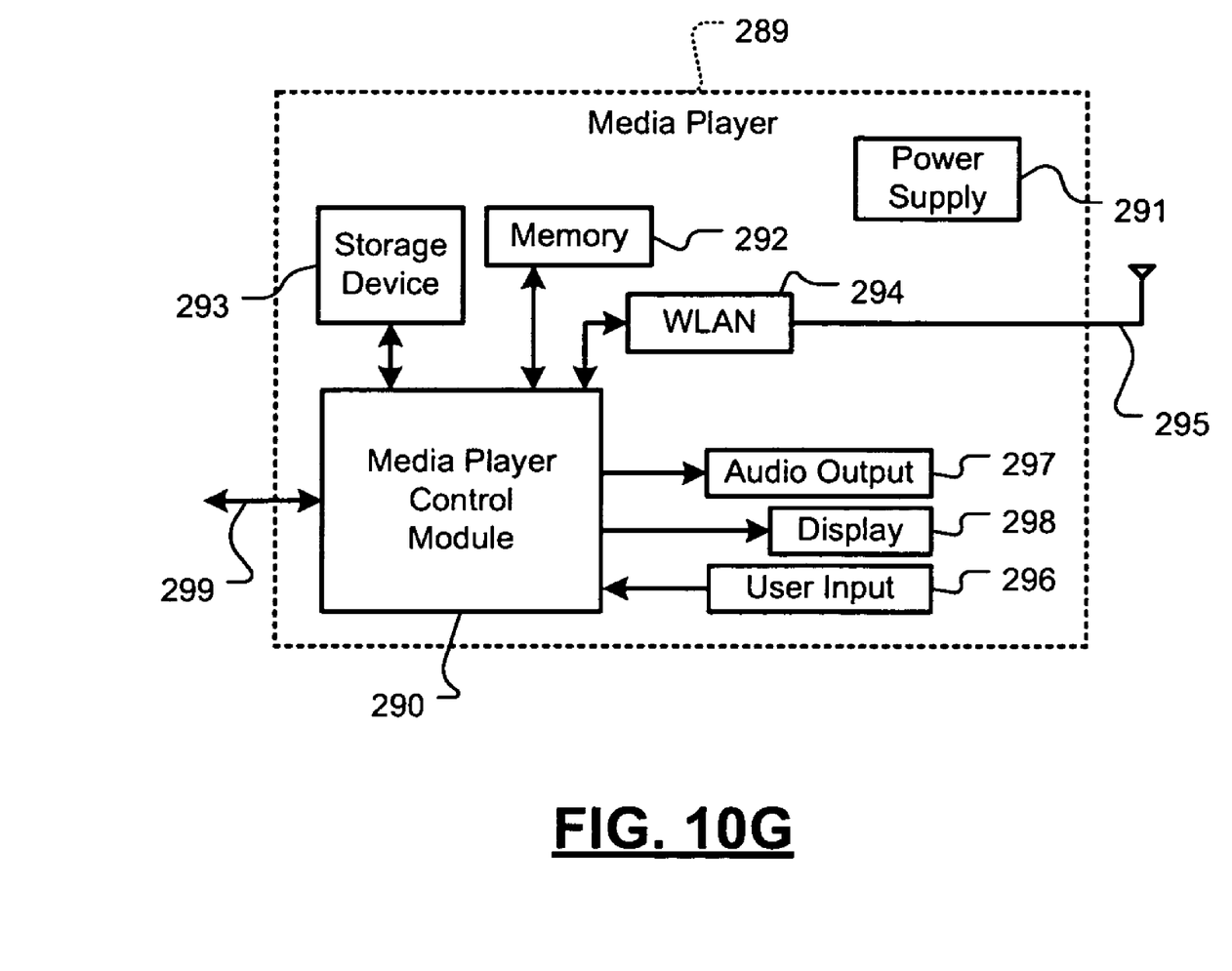
FIG. 10G is a functional block diagram of a media player.

Referring now to FIG. 10G, the teachings of the disclosure can be implemented in amplifiers of a media player control module 290. A media player 289 may include the media player control module 290, a power supply 291, memory 292, a storage device 293, a WLAN interface 294 and associated antenna 295, and an external interface 299.

The media player control module 290 may receive input signals from the WLAN interface 294 and/or the external interface 299. The external interface 299 may include USB, infrared, and/or Ethernet. The input signals may include compressed audio and/or video, and may be compliant with the MP3 format. Additionally, the media player control module 290 may receive input from a user input 296 such as a keypad, touchpad, or individual buttons. The media player control module 290 may process input signals, including encoding, decoding, filtering, and/or formatting, and generate output signals.

The media player control module 290 may output audio signals to an audio output 297 and video signals to a display 298. The audio output 297 may include a speaker and/or an output jack. The display 298 may present a graphical user interface, which may include menus, icons, etc. The power supply 291 provides power to the components of the media player 289. Memory 292 may include random access memory (RAM) and/or nonvolatile memory such as flash memory, phase change memory, or multi-state memory, in which each memory cell has more than two states. The storage device 293 may include an optical storage drive, such as a DVD drive, and/or a hard disk drive (HDD).

Those skilled in the art can now appreciate from the foregoing description that the broad teachings of the disclosure can be implemented in a variety of forms. Therefore, while this disclosure includes particular examples, the true scope of the disclosure should not be so limited since other modifications will become apparent to the skilled practitioner upon a study of the drawings, the specification and the following claims.

What is claimed is:

1. A compensated electrical circuit comprising:
   a first module that generates a first output signal based on a first transfer function;
   a second module that generates a second output signal based on a current control signal and a second transfer function; and
   a compensation module that generates the current control signal based on the first output signal and a mapping function, wherein the mapping function is based on the first transfer function and the second transfer function to reduce an effect of an independent variable on an overall transfer function that relates the first output signal to the second output signal,
   wherein:
     the first module is a first current source, the first output signal is a first current, the independent variable is temperature, and the second module is a voltage amplifier;
     the compensation module comprises:
       an opamp that generates a gate drive signal based on the first current; and
       a transistor that conducts control current of the current control signal based on the gate drive signal;
     the compensation module implements a linear transfer function of the form y=mx+p, where y is the control current, x is the first current, m is a slope and p is an intercept point;
     the compensation module further comprises a second current source that generates an offset current that passes through the transistor; and
     p is based on the offset current.

2. The compensated electrical circuit of claim 1, wherein at least one of the first transfer function and the second transfer function is a non-linear function.

3. The compensated electrical circuit of claim 1, wherein the first module further generates the first output signal based on a first input signal, and wherein the second module further generates the second output signal based on a second input signal.

4. The compensated electrical circuit of claim 1, wherein the mapping function is based on piecewise-polynomial approximations of the first transfer function and the second transfer function.

5. The compensated electrical circuit of claim 1, wherein the first transfer function relates the first output signal and the independent variable.

6. The compensated electrical circuit of claim 5, wherein the second transfer function relates the second output signal and the independent variable.

7. The compensated electrical circuit of claim 1, wherein the overall transfer function is independent of the independent variable.

8. The compensated electrical circuit of claim 7, wherein the relationship between the first output signal and the second output signal is linear.

9. The compensated electrical circuit of claim 7, wherein the relationship between the first output signal and the second output signal is a polynomial relationship.

10. The compensated electrical circuit of claim 1, further comprising a first resistance and a second resistance that communicate with the opamp, wherein m is based on a ratio of the first resistance and the second resistance.

11. The compensated electrical circuit of claim 1, wherein the mapping function is distinct from the first transfer function.

12. The compensated electrical circuit of claim 1, wherein the mapping function is distinct from the second transfer function.

13. The compensated electrical circuit of claim 1, wherein the second module adjusts the second output signal based on a current level of the current control signal.

14. The compensated electrical circuit of claim 1, wherein the current control signal varies based on level of the first current and the mapping function.

15. The compensated electrical circuit of claim 1, wherein the overall transfer function:
   is of the compensated electrical circuit; and
   is based on the first transfer function, the second transfer function, and the mapping function.

16. A method for compensating an electrical circuit, the method comprising:
   generating a first output signal based on a first transfer function;
   generating a second output signal based on a current control signal and a second transfer function;

generating the current control signal based on the first output signal and a mapping function, wherein the mapping function is based on the first transfer function and the second transfer function to reduce an effect of an independent variable on an overall transfer function that relates the first output signal to the second output signal, wherein the first output signal is a first current and the independent variable is temperature;

generating a gate drive signal based on the first current and conducting control current of the current control signal based on the gate drive signal; and wherein:
   generating the control current implements a linear transfer function of the form y=mx+p, where y is the control current, x is the first current, m is a slope and p is an intercept point;
   generating the control current signal further comprises generating an offset current; and
   p is based on the offset current.

17. The method of claim 16, wherein the first output signal is one of a voltage signal, a current signal, and a frequency signal.

18. The method of claim 16, wherein at least one of the first transfer function and the second transfer function is a non-linear function.

19. The method of claim 16, further comprising generating the first output signal based on a first input signal and generating the second output signal based on a second input signal.

20. The method of claim 16, wherein the mapping function is based on piecewise-polynomial approximations of the first transfer function and the second transfer function.

21. The method of claim 16, wherein the first transfer function relates the first output signal and the independent variable.

22. The method of claim 21, wherein the second transfer function relates the second output signal and the independent variable.

23. The method of claim 16, wherein the overall transfer function is independent of the independent variable.

24. The method of claim 23, wherein the relationship between the first output signal and the second output signal is linear.

25. The method of claim 22, wherein the relationship between the first output signal and the second output signal is a polynomial relationship.

26. The method of claim 16, wherein m is based on a ratio of a first resistance and a second resistance.

* * * * *